Feb. 17, 1970 H. R. LEE 3,496,427

SEMICONDUCTOR DEVICE WITH COMPOSITE ENCAPSULATION

Filed Jan. 13, 1966

INVENTOR:
HAROLD R. LEE,

BY Robert J. Mooney
HIS ATTORNEY.

United States Patent Office 3,496,427
Patented Feb. 17, 1970

3,496,427

SEMICONDUCTOR DEVICE WITH COMPOSITE ENCAPSULATION

Harold R. Lee, Auburn, N.Y., assignor to General Electric Company, a corporation of New York
Filed Jan. 13, 1966, Ser. No. 520,432
Int. Cl. H01l 3/00, 5/00
U.S. Cl. 317—234 4 Claims

ABSTRACT OF THE DISCLOSURE

A semiconductor device is provided comprising a body of semiconductor material containing a PN junction, metallic contacts on the semiconductor body and metallic leads joined to the contacts and extending therefrom. A protective layer of an oxide of the semiconductor device is applied to protect the PN junction. A layer of encapsulating material is provided to protectively enclose at least a portion of the leads and the exterior of the semiconductor body. A barrier layer material consisting of a methyl phenyl silicone thermosetting resin which is catalyzed with one or more metal salts is disposed between the encapsulating material and the semiconductor body.

This invention relates to improvements in semi-conductor devices having a body of semiconductor material provided with leads connected to contact areas thereon, and enclosed in a composite plastic encapsulant from which the leads extend. More particularly, the invention relates to such devices of which the encapsulant is characterized by capability of sustained operation in high ambient temperatures of up to 200° C., and extreme resistance to penetration of moisture even under sustained high relative humidity conditions.

Semiconductor devices such as transistors are known in which a pellet of semiconductor material is mounted on a metallic member which may serve as all or part of the electrical connector or external lead from one of the functionally significant regions of the device, such as the transistor emitter or base or collector region. Other electrical connectors such as wires or other electrically conductive membes are connected to the other functionally significant regions of the pellet, and may in turn be attached to, or may themselves constitute, additional external electrical leads of the device. In such devices the assemblage, including the pellet and at least a portion of the electrical connectors thereto, is encapsulated, for example by casting or molding, in a suitable electrically insulative material such as an epoxy resinous composition from which the outer portions of the external leads extend. The external leads may additionally extend through a header of electrically insulative material such as a plastic material which serves to support, space, or orient the leads, and the encapsulating material may desirably extend to and be contiguous with the header.

Although the semiconductor pellet in such devices is frequently of the type wherein its electrically significant regions are at least partly protected from contamination by moisture and other environmental impurities by a protective coating carried directly by the semiconductor material itself, such as a thin layer of oxide of silicon in the case of a silicon pellet, the encapsulation provides further permanent protection against mechanical and thermal shock, chemical attack or the like, and ruggedizes the device so as to simplify subsequent handling, packaging, shipping, and use.

One of the problems that has been encountered with this type of device is that during electrical operation under conditions wherein PN junction temperatures within the pellet exceed about 100° C., epoxy resin encapsulating materials heretofore employed contiguous to the pellet may become chemically reactive with the pellet sufficiently to degrade some of the electrical parameters of the pellet. This degradation has been observed for example as a decrease in DC beta or $h_{FE}$ of transistors devices (DC beta being defined as the common-emitter forward large-signal current gain). Manifestly, degradation of such parameters as transistor DC beta is quite undesirable for many circuit applications, and the present invention is directed to improvements which prevent or substantially eliminate degradation of this kind.

Accordingly, one object of the present invention is to provide improved semiconductor devices of the encapsulated type having improved performance at high ambient temperatures up to 200° C.

Another object is to provide a transistor of the foregoing character wherein the degradation of the DC beta at junction operating temperatures at or above 100° C. is minimized.

Another object is to provide improved junction semiconductor devices of the foregoing character wherein the foregoing advantages are obtained with a minimum addition to the cost of the device and with a minimum of change or disruption of process or assembly steps heretofore employed in the manufacture of such devices.

Another object is to provide an improved plastic encapsulated semiconductor device having enhanced moisture permeability resistance under prolonged exposure to high humidity conditions of up to 100% relative humidity, and having minimized susceptibility to degradation by exposure of the extending leads thereof to etching solutions and metal plating solutions.

Another object is to provide a low cost semiconductor device of the plastic encapsulated type in which chemical reaction with, or degradation of, the semiconductor pellet by the encapsulant is substantially precluded at temperatures up to 200° C.

These and other objects of the invention will be apparent from the following description and the accompanying drawing wherein.

Figure 1:
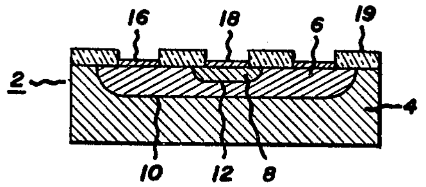
FIGURE 1 is an enlarged sectional view of the semiconductor pellet portion of one type of semiconductor device to which my invention is particularly applicable.
Figure 2:
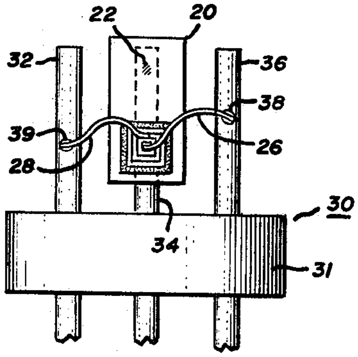
FIGURE 2 is a fragmentary view of a semiconductor device utilizing the pellet of FIGURE 1, and at an intermediate stage of manufacture.

Referring to the drawing, the present invention is applicable to a variety of semiconductor devices but is illustrated for convenience and by way of example as applied to a transistor. As constructed in accordance with the present invention, the transistor shown includes an electrically active element consisting of a body or pellet 2 of semiconductor material such as silicon, of wafer-like form having a thickness of, for example, 5 to 8 mils and having an area of, for example, 100 to 400 square mils. The pellet has a plurality of electrically active regions which may include, for example, a collector region 4, base region 6, and emitter region 8. The pellet may be suitably treated with additives or impurities, for example, by impurity diffusion, so that the base region 6 is of opposite conductivity type to that of the emitter region 8 and collector region 4, thus defining a pair of PN junctions, indicated generally at 10 and 12, within the pellet. The pellet may include, for example, a collector region 4 of N-type silicon, a P-type base region 6 formed by diffusion into the pellet of an impurity such as boron, and an N-type emitter region 8 formed by diffusion into the base region of an impurity such as phosphorus. Conductive coatings, for example of aluminum, are applied to the base and emitter regions, respectively, to form non-rectifying contacts 15, 18 facilitating attachment of respective leads thereto. At the surface of the pellet, between the emitter and base contacts 16, 18 and over the intersection of the loci of the junctions 10, 12 with the pellet surface, the pellet is provided with a protective covering 19 of insulative material which in the case of a silicon pellet may conveniently consist of an oxide of the silicon.

The pellet is mounted on a carrier 20 which may consist, for example, of Kovar or steel, having a ribbon-like cross-section of, for example, 50 mils in width and 5 to 10 mils in thickness. The major face of the pellet opposite that of the base and emitter contact regions 15, 18 is permanently conductively secured to carrier 20 as, for example, by soldering or welding to provide a non-rectifying conductive contact. To facilitate the attachment of the pellet to the carrier, an intermediate layer of a metal 24, such as gold or gold doped with an impurity of the same conductivity type as the collector region of the pellet, may be employed to form a solder between the carrier 20 and the pellet 2.

An emitter lead 26, such as an elongated metallic member of gold or other suitable metal having a cross-section of the order of one square mil, is permanently joined at one of its ends in non-rectifying electrical contact to the emitter contact 18 of the pellet. A similar base lead 28 is likewise permanently joined to the base contact 16.

The carrier 20 is mechanically and electrically conductively attached as by a weld 22 to the center post 34 of a header assembly 30 including a disk or platform header of electrically insulative plastic material 31, through which the center post 34 extends. Likewise extending through the header 31 are side posts 32 and 36 to which the base lead 28 and emitter lead 26 are respectively secured as by welds 39, 38. The header 31 may serve as a permanent or temporary support for maintaining the spacing and relative position of the external leads constituted by the three posts 32, 34 and 36.

Figure 4:
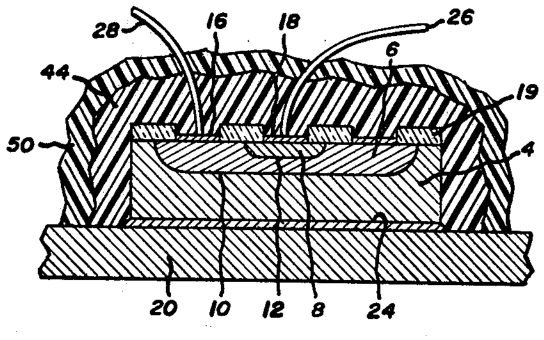
FIGURE 4 is an enlarged fragmentary sectional view of a portion of the structure of FIGURE 3.
Figure 5:
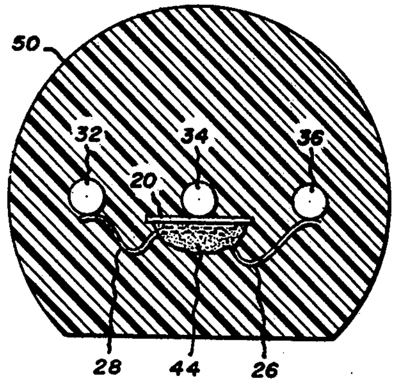
FIGURE 5 is a top view of a structure similar to that shown in FIGURE 2, after further processing according to my invention.
Figure 6:
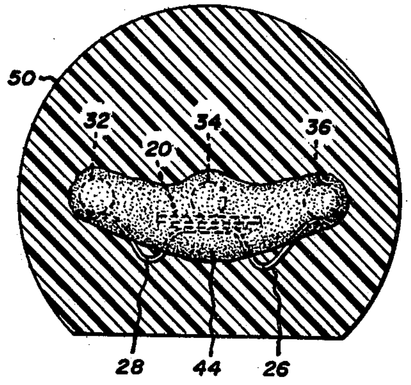
FIGURE 6 is a view similar to FIGURE 5, illustrating a different form of the application of my invention.

Ultimately, in the manufacture of the device herein described, the semiconductor pellet 2, or at least the surfaces thereof not attached to a substrate such as carrier 20, and the portions of the leads 26, 28 adjacent pellet 2, are protectively covered by an insulative encasement 50 of a suitable material such as a castable epoxy resin or transfer-moldable silicone resin, as will hereinafter be more fully described. However, prior to this encapsulation stage, in accordance with my invention, the assemblage of pellet and adjacent increments of its electrical leads 26, 28, as shown in FIGURE 4, is covered by a layer of material which serves as a barrier or separator 44 to keep the covering layer of encapsulating material 50 out of direct contact with the semiconductor pellet and the root portions of leads 26, 28.

The material of barrier layer 44 should be electrically insulative and chemically non-reactive with the encapsulating material 50 and other contiguous materials. It is also important that the barrier material be non-ionizable, and make a satisfactory thermal expansion coefficient match with the semiconductor pellet 2, encapsulant 50, and other contiguous materials so as to avoid fracture during thermally responsive changes in dimensions. It is also desirable that the barrier material 44 have a high resistance to permeability of moisture, even at high temperatures of about 200° C., and make an excellent bond with metallic leads 26, 28 and with other metallic interfaces such as the surface of substrate 20 so as to resist penetration of moisture or other chemically reactive liquids or vapors at such interfaces.

A preferred material for barrier 44, according to the present invention is a methyl diphenyl silicone thermosetting resin having an average about 1.1 to 1.75 total methyl and phenyl groups per silicon atom and having about 0.5 to 5.0 methyl groups per phenyl group. Such a resin has the formula $$R_NSiO_{\frac{4-N}{2}}$$

where N is between 1.1 and 1.75 and R is a mixture of methyl and phenyl radicals having 0.5 to 5.0 phenyl groups per methyl group. Such resin is available commercially as SR–324 from General Electrical Company, Silicone Products Department, Waterford, N.Y. Prior to application, the resin is preferably diluted with a compatible diluent such as about 60 percent by weight toluene to facilitate application, and is polymerized with a catalyst curing agent consisting of about one part by weight lead octoate and about two parts by weight dibutyl tin dioctoate in about 30 parts by weight toluene. One such suitable curing agent is that available commercially as SRC–07 from General Electric Company, Silicone Products Department, Waterford, N.Y.

A satisfactory formulation for barrier material 44 prior to application is as follows.

| Ingredient: | Percent by weight |
|---|---|
| Methyl phenyl silicone resin (SR–324) | 30–75 |
| Toluene diluent | 25–55 |
| Bimetal salt catalyst (SCR–07) | 0.3–0.7 |

The barrier 44 may be applied, at room temperature, in any suitable manner such as by dispensing through a syringe, brushing, spraying, dipping or dabbing. Once the barrier layer 44 is thus applied, it is allowed to set, or is baked, in air at room temperature or slightly above for a sufficient time, such as 10 to 30 minutes, to allow a substantial portion of the toluene diluent to evaporate. The barrier may then be cured by baking an air at about 80 to 200° C. for about ¾ to 2 hours.

Figure 3:
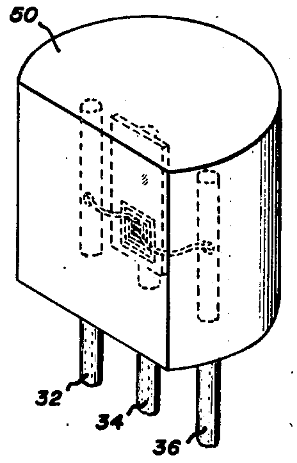
FIGURE 3 is a perspective view showing the structure of FIGURE 2 after manufacture is completed according to my invention.

Following formation of the barrier layer 44 as above described, the composite encapsulation of the device may be completed by application of the exterior layer of encapsulant 50. Preferably, encapsulant 50 should have a desirably high imperviousness to moisture. The encapsulant 50 should also preferably make a good thermal expansion coefficient match with the materials which it encloses, and, if the header 31 is to be permanently retained, with the material of the header. One suitable encapsulant is an acid anhydride-hardenable resin known by the trade name "D.E.N. QX–2638.1" and commercially available from the DOW Chemical Company. This resin, when mixed with a polycarboxylic acid anhydride hardener, such as that known by the trade name "Nadic Methyl" available commercially from the General Chemical Company, and a low viscosity diluent such as that known by the trade name "Unox 206" commercially available from the Union Carbide Company, can be cast or molded in place as shown in FIGURE 3, and suitably cured or hardened by heating for a few hours at 100° C. A known catalyst for such a resinous composition, such as benzyldimethyl amine, may be used to reduce curing time, if desired. Various other materials for encapsulant 50 may be used, such as other filled or unfilled commercially available epoxy resinous compositions, or various commercially available silicone resinous transfer-molding compositions. Other encapsulating materials, such as glass, or a radiation-opaque material such as lead may also be employed.

An electronic component such as a semiconductor device constructed according to my invention has many advantages. Though not necessarily in itself mechanically strong or permanently rugged enough to stay in place, the barrier material 44 is locked in place by encapsulant 50 so as to provide a permanent spacer or barrier permanently preventing contact and chemical interaction between the encapsulant material 50 and the pellet. Furthermore, the barrier material is substantially completely impervious to the passage of gassy or liquid contaminants or other deleterious materials which may be evolved from the encapsulant material 50 during operation of the semiconductor device at high internal temperature. Also, the barrier 44 effectively prevents penetration of moisture or other chemically reactive materials at the interface of the barrier with leads 26, 28 or carrier 20, thus minimizing electrical or chemical degradation of the pellet as a result of exposure, after the encapsulation of extending portions of leads 26, 28, or posts 32, 34, 36, or the like, to etching or plating solutions. The barrier 44 also decreases the importance of chemical activeness of the material of encapsulant 50 as a factor in choice of encapsulant 50, allowing a wider latitude in chemical properties of encapsulant 50 and enabling the encapsulant to be optimized for thermal and mechanical properties such as good thermal conductivity and expansion matching, and increased resistance to shock and vibration. The cost of the barrier 44 is relatively insignificant and it is easy to apply, yet its presence not only increases device tolerance to momentary excessive electrical stress, but also materially improves the long-term operating characteristics of junction semiconductor devices subject to such thermo-chemically induced electrical degradation, particularly at the high junction temperatures associated with high power operation, thereby providing improved longer life and higher reliability junction semiconductor devices.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What I claim as new and desire to secure by Letters Patent of the United States is:

1. A PN junction semiconductor device comprising a body of semiconductor material containing at least one PN junction, a film of an oxide of said semiconductor material on the semiconductor body and covering said PN junction, metallic contacts on said body, metallic leads joined to said contacts and extending therefrom, a layer of encapsulating material protectively enclosing at least a portion of said leads and the exterior of said semiconductor body, and a barrier layer consisting essentially of methyl phenyl silicone thermosetting resin disposed between said encapsulating material and said semiconductor body wherein said resin has the formula $$R_NSiO_{\frac{4-N}{2}}$$

and wherein R is a mixture of methyl and phenyl groups having a ratio of 0.5 to 5.0 phenyl groups per methyl group.

2. A moisture permeability-resistant composite encapsulant for a semiconductor device including a body of semiconductor material having metallic leads extending therefrom, said encapsulant comprising a thermosetting resinous outer layer for protectively enclosing at least a portion of said leads and the exterior of said semiconductor body, and an inner layer adapted to be disposed as a barrier between the outer layer and semiconductive body, said inner layer consisting essentially of methyl phenyl silicone thermosetting resin having the formula $$R_NSiO_{\frac{4-N}{2}}$$

wherein N is between 1.1 and 1.75 and wherein R is a mixture of methyl and phenyl groups having a ratio of 0.5 to 5.0 phenyl groups per methyl group, said resin being catalyzed with a mixture of lead octoate and dibutyl tin dioctoate.

3. A composite encapsulant as defined in claim 2 wherein said resin has the formula $$R_NSiO_{\frac{4-N}{2}}$$

wherein N is between 1.1 and 1.75, where R is a mixture of methyl and phenyl groups having a ratio of 0.5 to 5.0 phenyl groups per methyl group, and where the catalyst is composed of a mixture of lead octoate and dibutyl tin dioctoate.

4. A PN junction semiconductor device as defined in claim 1 wherein N is between 1.1 and 1.75 and wherein R is a member selected from the class consisting of monovalent hydrocarbon radicals and substituted monovalent hydrocarbon radicals.

References Cited

UNITED STATES PATENTS

| | | | |
|---|---|---|---|
| 2,706,190 | 4/1955 | Clark | 260—16.5 |
| 3,231,532 | 1/1966 | Modic | 260—29.1 |
| 2,449,572 | 9/1948 | Welsh | 260—46.5 |

JAMES D. KALLAM, Primary Examiner

MARTIN H. EDLOW, Assistant Examiner

U.S. Cl. X.R.

260—29.1, 46.5